(12) United States Patent
Bain

(10) Patent No.: US 6,777,993 B1
(45) Date of Patent: Aug. 17, 2004

(54) METHOD AND APPARATUS FOR ADJUSTING THE PHASE AND FREQUENCY OF A PERIODIC WAVE

(75) Inventor: Peter D. Bain, Ottawa (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 10/189,924

(22) Filed: Jul. 3, 2002

Related U.S. Application Data

(60) Provisional application No. 60/310,584, filed on Aug. 7, 2001.

(51) Int. Cl.[7] .................................................. H03K 3/00
(52) U.S. Cl. ........................ 327/237; 327/248; 327/276
(58) Field of Search .................................. 327/233, 234, 327/235, 237, 240, 241, 248, 276, 277, 270, 271

(56) References Cited

U.S. PATENT DOCUMENTS

| | | | | |
|---|---|---|---|---|
| 5,838,755 A | * | 11/1998 | Tammelin | 377/48 |
| 6,037,812 A | * | 3/2000 | Gaudet | 327/116 |
| 6,104,223 A | * | 8/2000 | Chapman et al. | 327/276 |

* cited by examiner

Primary Examiner—Timothy P. Callahan
Assistant Examiner—An T. Luu
(74) Attorney, Agent, or Firm—L. Cho

(57) ABSTRACT

A delay circuit includes a phase vernier having a plurality of logic components. Each logic component includes a selectable injection input capable of adjusting a phase of an input to the phase vernier.

23 Claims, 21 Drawing Sheets

METHOD AND APPARATUS FOR ADJUSTING THE PHASE AND FREQUENCY OF A PERIODIC WAVE

This application claims the benefit of Provisional application Ser. No. 60/310,584, filed Aug. 7, 2001.

FIELD OF THE INVENTION

The present invention relates to the field of frequency generation devices such as clocking devices in electrical systems. More specifically, the present invention relates to a method and apparatus for adjusting the phase and frequency of a periodic wave.

BACKGROUND OF THE INVENTION

In applications such as plesiochronous or isochronous telecommunication systems, it is desirable to make adjustments to the phase of a clock in order to synchronize the clock with an external reference. It may also be necessary in these applications to generate a positive or negative frequency adjustment to the clock. The phase and frequency adjustments may be accomplished by periodically adjusting the phase of the clock by advancing or retarding the phase of the clock.

In the past, analog circuits such as phase locked loops, mixers and other electrical circuits having inductors and capacitors were used to offset the frequency and phase of a clock. These analog circuits adjusted the phase and frequency directly or smoothed out phase discontinuities by adding or dropping clock pulses. A second approach used in the past to provide a clock with a phase and frequency matching an external reference was to synthesize a clock with the desired phase and frequency characteristics of the external reference. This was achieved by dividing an internal clock operating at a higher speed clock. By changing the modulus of the divider, the phase or frequency of the synthesized clock could be adjusted. Both these approaches, however, suffered from various drawbacks. The analog circuits used to offset the frequency and phase of a clock could not be constructed using digital circuit components. In order to implement the analog circuits, special design consideration had to be given to the placement of the circuit components. Alternatively, the analog circuits had to be placed off-chip. The approach of synthesizing a clock with the desired phase and frequency characteristics of the external reference required a clock operating at a much higher frequency than the external reference. Implementing a high speed clock was difficult and costly.

Thus, what is needed is an efficient and effective method and apparatus for adjusting the phase and frequency of a period wave.

SUMMARY

According to an embodiment of the present invention, a phase vernier is implemented using a chain of logic components. A phase and frequency of a periodic wave inputted into the phase vernier may be adjusted by selecting an inject input of a logic component and setting the logic component to an inject mode. The phase vernier may operate to add or delete integral half-cycles or full-cycles of the periodic wave to permit unlimited phase adjustments. The phase vernier may be implemented using digital logic circuits which allow it to be more easily integrated into an electronic system. The phase vernier may operate to adjust the phase and frequency of a periodic wave without requiring the period wave to be generated using a high speed clock.

A delay circuit is disclosed according to an embodiment of the present invention. The delay circuit includes a phase vernier having a plurality of logic components. Each of the logic components has a selectable inject input capable of adjusting a phase of an input of the phase vernier.

A method for adjusting a phase of an input using a delay circuit is disclosed according to a first embodiment of the present invention. The phase is advanced by setting a logic component in a last stage of the delay circuit to an inject mode. Forward wrapping is performed. The phase is further advanced by setting a logic component in a stage subsequent to a secondary injection point to the inject mode.

A method for adjusting a phase of an input using a delay circuit is disclosed according to a second embodiment of the present invention. The phase is retarded by setting a logic component in a first stage of the delay circuit to an inject mode. Backward wrapping is performed. The phase is further retarded by setting a logic component in a stage prior to a secondary injection point to the inject mode.

BRIEF DESCRIPTION OF THE DRAWINGS

The features and advantages of the present invention are illustrated by way of example and are by no means intended to limit the scope of the present invention to the particular embodiments shown, and in which.

DETAILED DESCRIPTION

Figure 1:
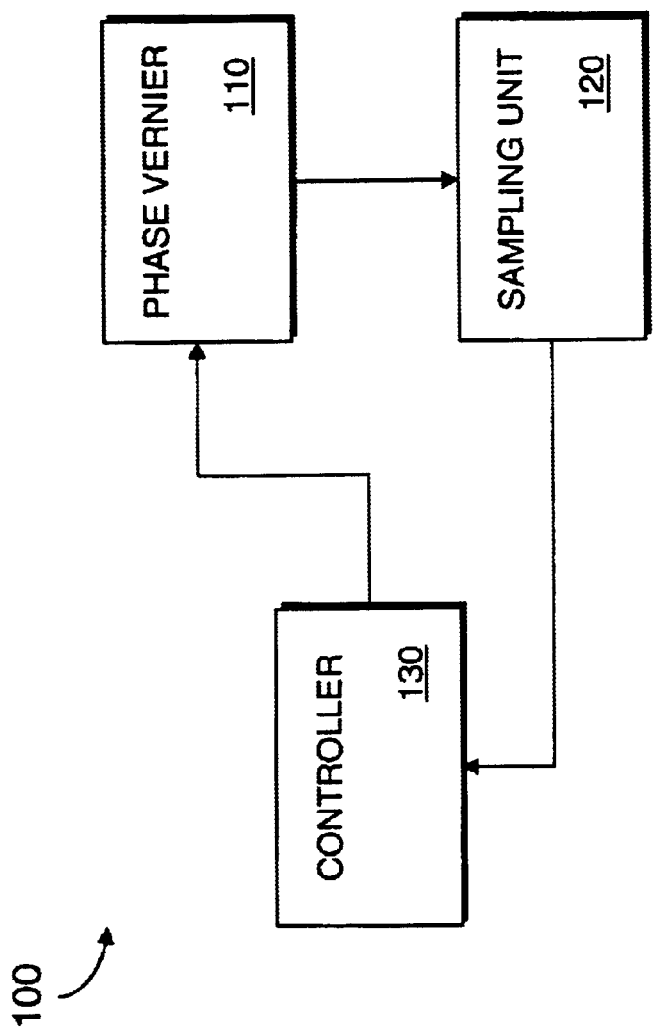
FIG. 1 is a block diagram that illustrates a delay circuit according to an embodiment of the present invention.

FIG. 1 is a block diagram of a delay circuit 100 according to an embodiment of the present invention. The delay circuit 100 operates to adjust the phase and/or frequency of an input such as a periodic wave. The delay circuit 100 includes a phase vernier 110. The phase vernier 100 includes a plurality of logic components (not shown) connected in series. Each of the logic components is designated a stage in the phase vernier and each provides a delay stage. An input to a logic component is output after a time period provided by the delay stage. Each of the logic components includes a selectable injection input. According to an embodiment of the phase vernier 110, a logic component may output an input from a previous logic component connected to it in the series or a signal at its clock input in response to the injection input. The selectable injection inputs of the logic components in the phase vernier 110 may be selected to adjust the phase and/or frequency of an input to the phase vernier such that an output at the last stage of the phase vernier includes the input adjusted to the desired phase and/or frequency.

Figure 2:
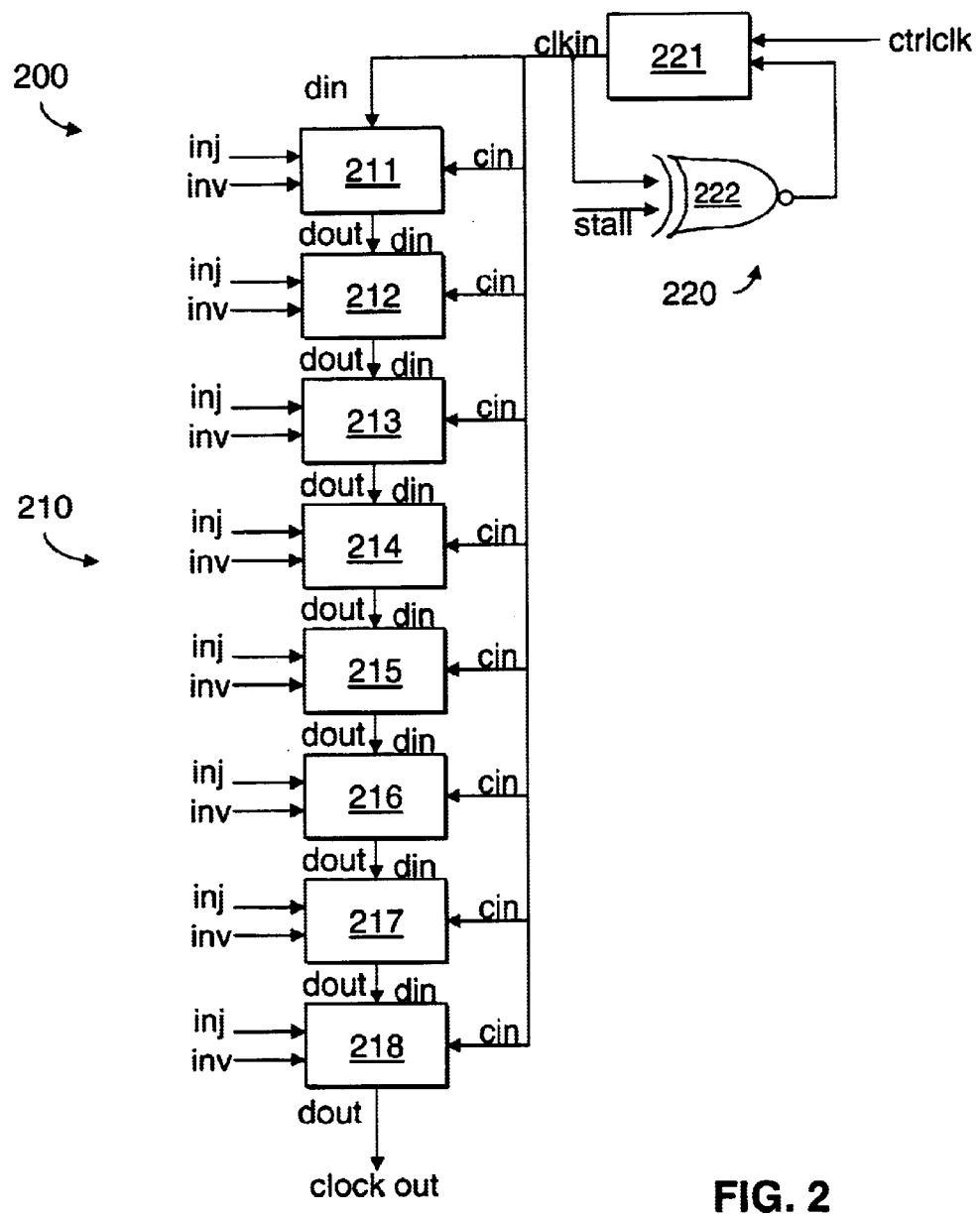
FIG. 2 is a block diagram illustrating a phase vernier according to an embodiment of the present invention.

FIG. 2 is a block diagram that illustrates an embodiment of a phase vernier 200. The phase vernier 200 may be implemented as the phase vernier 110 shown in FIG. 1. The phase vernier includes a plurality of logic components 210 referred to individually as logic components 211–218. Each of the logic components includes a delay input (din), clock input (cin), injection input (inj), inversion input (inv), and delay output (dout). The plurality of logic components 210 are connected in series where the delay output of a logic component is connected to the delay input of subsequent logic component in the series. The first logic component 211 in the series receives a clock input at its delay input. The delay output of the last logic component 218 in the series is the adjusted input clock and is designated as clock out.

Each of the logic components is designated a stage in the phase vernier 200 that provides a delay stage. Logic component 211 is a first logic component in the phase vernier 200 and is in a first stage of the phase vernier 200. Logic component 212 is a second logic component in the phase vernier 200 and is in a second stage of the phase vernier 200. Logic component 213 is a third logic component in the phase vernier 200 and is in a third stage of the phase vernier 200. Logic component 214 is a fourth logic component in the phase vernier 200 and is in a fourth stage of the phase vernier 200. Logic component 215 is a fifth logic component in the phase vernier 200 and is in a fifth stage of the phase vernier 200. Logic component 216 is a sixth logic component in the phase vernier 200 and is in a sixth stage of the phase vernier 200. Logic component 217 is a seventh logic component in the phase vernier 200 and is in a seventh stage of the phase vernier 200. Logic component 218 is a eighth logic component in the phase vernier 200 and is in a eighth stage of the phase vernier 200. An input to a logic component is output after a time period provided by its delay stage.

Eight logic components 211–218 are shown in the phase vernier 200. According to an embodiment of the present invention, the phase vernier 200 includes N-logic components, where N is a number of logic components that provides a cumulative delay equal to at least half a clock period of the input clock. The number of logic components required is half the clock period divided by the minimum propagation delay per logic component.

According to an embodiment of the phase vernier 200, each of the logic components may be set to one of three modes. In a passthrough mode, the delay output of a logic component outputs an input at the delay input. In an inject mode, the delay output of a logic component outputs an input at the clock input. In an invert mode, the delay output of a logic component outputs an inverse input at the clock input. In one embodiment, a logic component is set to a passthrough mode when the injection input and inverse input receive zeros. A logic component is set to an inject mode when the inject input receives a one and the inverse input receives a zero. A logic component is set to an invert mode when the inject input and the inverse input receive ones. The logic components 211–218 may be implemented using field programmable gate array (FPGA) look up tables or other devices.

The phase vernier 200 includes a clocking circuit 220. The clocking circuit 220 includes a clock divider 221 that receives a clocking signal (cntrlclk) from a clock (not shown) operating at twice the frequency of the clock out. The clock divider 221 divides the clocking signal by two to generate the input clock (clkin). The input clock is distributed in parallel to the clock input of the logic components 211–218. According to an embodiment of the phase vernier 200, the clocking circuit 220 optionally includes a clock regulator 222. The clock regulator 222 operates to stall the output of the clock divider 221 in response to a stall signal. According to an embodiment of the clocking circuit 220, the clock divider 221 may be implemented by a DQ flip-flop and the clock regulator 222 may be implemented by a circuit performing an exclusive-NOR function.

Figure 3:
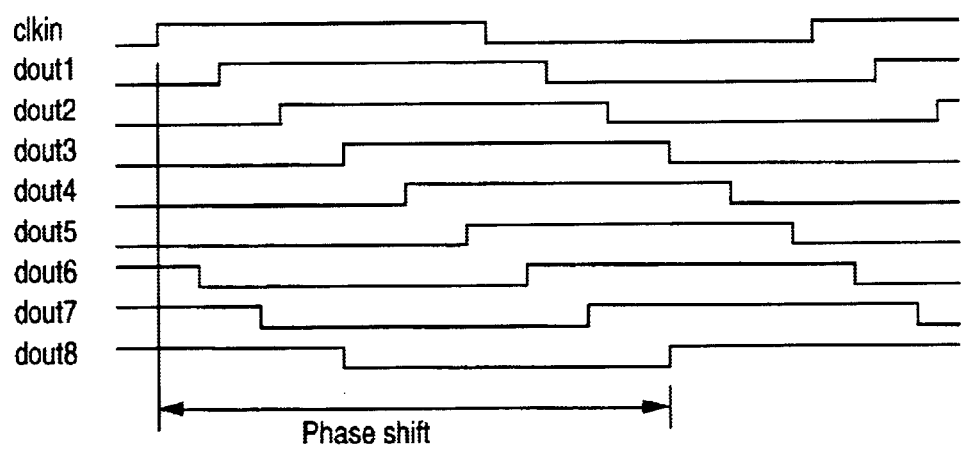
FIG. 3 is a timing diagram illustrating a state of the phase vernier shown in FIG. 2 set to a maximum phase delay configuration according to an embodiment of the present invention.

The phase vernier 200 may be used to retard a phase of the input clock. This may be achieved by setting the logic components 210 of the phase vernier 200 to a specified mode. For instance, by setting one of the logic components 211–218 to an inject mode, the signal at the clock input becomes subject to a delay of that logic component and all subsequent logic components connected to the logic component before it is output at the delay output of the last logic component 218. For example, by setting the first logic component 211 to an inject mode, the first logic component 211 will output the signal at the clock input at its delay output. Setting all subsequent logic components 212–218 to a passthrough mode enables logic components 212–218 to pass on the signal at the clock input from a previous logic component in the phase vernier 200. FIG. 3 is a timing diagram that illustrates the delay output for the logic components 211–218 (shown in FIG. 2). By setting the first logic component 211 to an inject mode and logic components 212–218 to the passthrough mode, the phase vernier 200 (shown in FIG. 2) is set to a maximum phase delay configuration of the phase vernier 210.

The phase vernier 200 may be used to advance a phase of a clock out signal. As stated, when a logic component is set to an inject mode, it outputs the signal at the clock input at its delay output. Thus, the phase of the clock out signal at the delay output of the logic component 218 may be advanced (decreased) by having a logic component set in the inject mode ("the injection point") moved forward to a later stage.

Figure 4:
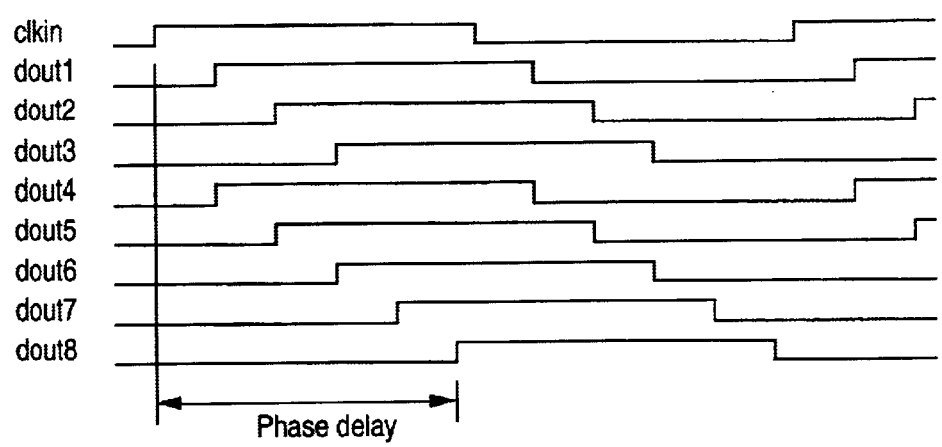
FIG. 4 is a timing diagram illustrating a state of the phase vernier shown in FIG. 2 having a phase advanced according to an embodiment of the present invention.

FIG. 4 is a timing diagram that illustrates the delay output for the logic components 211–218 (shown in FIG. 2) where the injection point is moved from stage 1 to stage 4. Notice the reduced delay of the clock signal at the delay output of the logic component 218.

Typically, in order to retard a phase of a clock signal, a logic component which is in the inject mode is moved from its present stage, G, to a previous stage G–1 by setting the logic component at stage G to a passthrough mode and a logic component at stage G–1 to an inject mode. To reduce glitches, the logic component at stage G–1 should be set to inject mode prior to the logic component at stage G is set to passthrough mode. This ensures that the delay input of the logic component at stage G is in the correct state when the logic component's mode is changed. This approach, however, is limited to a total phase shift equal to the length of the phase vernier. Notice that in FIG. 3, the phase cannot be retarded anymore since there is no stage before stage 1. Similarly, in order to advance a phase of a clock signal, a logic component which is in the inject mode is moved from its present stage, G, to a next state G+1. This approach is also limited to a total phase shift equal to the length of the phase vernier. Notice that in FIG. 4, after the logic component 218 (shown in FIG. 2) is set to the inject node, the phase cannot be advanced anymore since there is no state after stage 8.

The phase vernier 200 (shown in FIG. 2) is able to take advantage of the periodic nature of the input clock to allow for unlimited adjustments to its phase and frequency. When the phase vernier 200 includes a number of logic components that provides a cumulative delay equal to a full clock period of the input clock, full-cycle wrapping may be performed. When the phase vernier 200 includes a number of logic components that provides a cumulative delay equal to a half clock period of the input clock, half-cycle wrapping may be formed. Full-cycle and half-cycle wrapping are techniques that may be used to shift an injection point from one stage of the phase vernier 200 to another while maintaining a same phase output at the delay output of the last logic component of the phase vernier 200. Thus, with full-cycle or half-cycle wrapping, an injection point at either the first stage or last stage of the phase vernier 200 may be shifted to an alternate stage allowing further advancing or retarding of the phase of the input clock to be made.

According to an embodiment of the present invention, full-cycle wrapping is performed by identifying a secondary injection point at a stage a full clock period ahead or behind a current injection point. The injection point is shifted from the current injection point to the secondary injection point. Similarly, half-cycle wrapping is performed by identifying a secondary injection point at a stage a half clock period ahead or behind a current injection point. The injection point is shifted from the current injection point to the secondary injection point while an input signal that is a half-cycle out of phase with the input clock is transmitted into the clock input of the logic component at the stage of the secondary injection point.

According to an embodiment of the present invention, the secondary injection point may be determined for full-cycle and half-cycle wrapping using an estimation technique. For full-cycle wrapping, a number of stages required for generating a delay equal to a full-cycle of the input may be estimated. If all the logic components introduce a delay of equal length, the number of stages may be estimated as being the period of time for a full-cycle of the input divided by the delay introduced by one logic component. When advancing a phase delay ("forward wrapping"), the number of stages estimated may be subtracted from the last stage of the phase vernier to determine the secondary injection point. When retarding a phase delay ("backward wrapping"), the number of stages estimated may be added to the first stage of the phase vernier to determine the secondary injection point.

For half-cycle wrapping, a number of stages required for generating a delay equal to a half-cycle of the input may be estimated. If all the logic components introduce a delay of equal length, the number of stages may be estimated as being the period of time for a half-cycle of the input divided by the delay introduced by one logic component. When forward wrapping, the number of stages estimated may be subtracted from the last stage of the phase vernier to determine the secondary injection point. When backward wrapping, the number of stages estimated may be added to the first stage of the phase vernier to determine the secondary injection point.

According to an embodiment of the present invention, the secondary injection point may be determined for full-cycle and half-cycle wrapping using a measurement technique. Referring to FIG. 1, the measurement technique is performed with the assistance of a sampling unit 120. The sampling unit 120 is coupled to the phase vernier 110 and samples the state of the phase vernier 110 by sampling outputs from each logic component.

Figure 5:
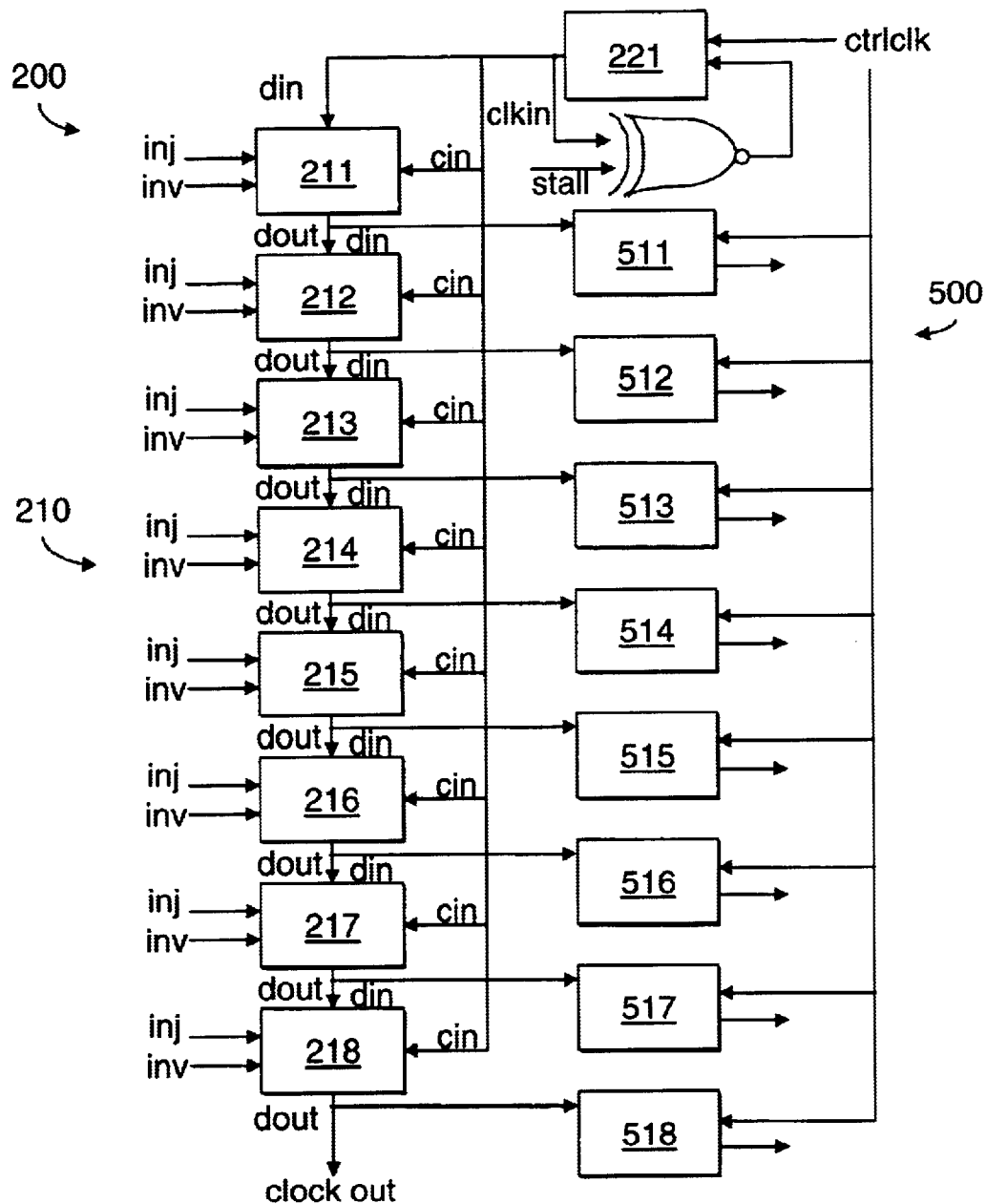
FIG. 5 is a block diagram illustrating a phase vernier and a sampling unit according to an embodiment of the present invention.

FIG. 5 is a block diagram illustrating a sampling unit 500 coupled to the phase vernier 200 shown in FIG. 2. The sampling unit 500 may be implemented as the sampling unit 120 shown in FIG. 1. The sampling unit 500 includes a plurality of flip-flops 511–518. Each of the flip-flops is coupled to one of the logic components 210 at its delay output and is clocked by the clocking signal (cntrlclk). The sampling unit 500 samples the state of the phase vernier 200 as the rising or falling edge of the input clock is injected into the phase vernier 200. The concatenation of the outputs of the flip-flops 511–518 is a sample vector. The sampling unit 500 shown in FIG. 5 includes eight flip-flops. It should be appreciated, however, that the sampling unit 500 would implement a number of flip-flops equal to the number of logic components or stages in the phase vernier it is sampling. It should also be appreciated that the sampling unit 500 may implemented using other known circuitry or techniques.

Figure 6:
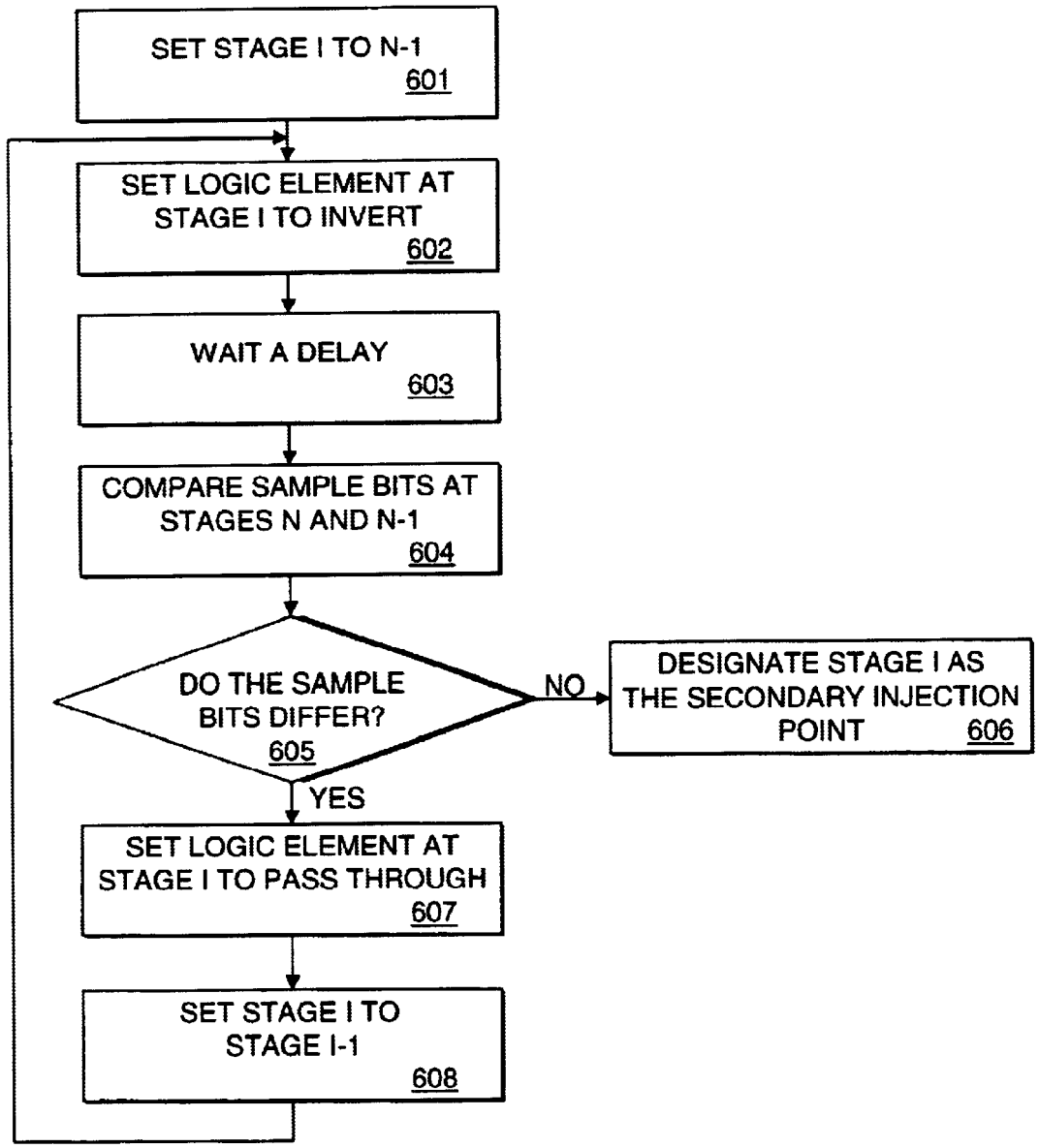
FIG. 6 is a flow chart illustrating a method for determining a secondary injection point for half-cycle forward wrapping according to an embodiment of the present invention.

FIG. 6 is a flow chart illustrating a method for determining a secondary or new injection point for half-cycle forward wrapping according to an embodiment of the present invention. At step 601, I is set to a value N–1, where N is the number of logic components or stages of a phase vernier.

At step 602, a logic component at stage 1 is set to an invert mode.

At step 603, a delay is allowed to pass. According to an embodiment of the present invention, the delay may be a full cycle of the clocking signal.

At step 604, the value at the delay output of the logic components at the Nth stage (the last stage) of the phase vernier and the value at the delay output of the logic component at the N–1th stage (second to last stage) of the phase vernier are compared.

At step 605, it is determined whether the values at the delay outputs differ. If the values do not differ, control proceeds to step 606. If the values differ, control proceeds to step 607.

At step 606, stage 1 is designated as the secondary or new injection point.

At step 607, the logic component at stage 1 is set to a passthrough mode.

At step 608, the value I is set to a value I–1. Control returns to step 602.

Figure 7:
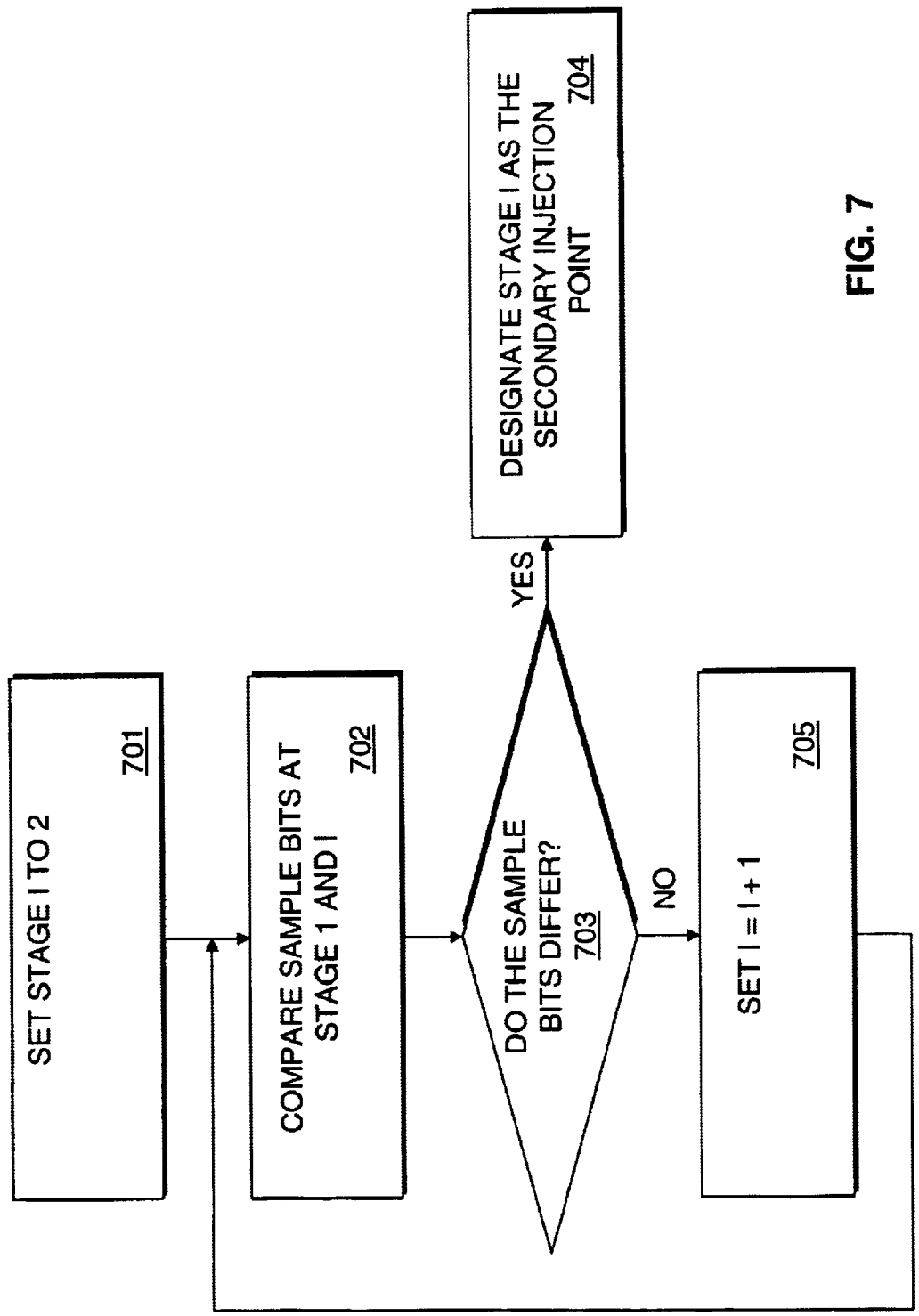
FIG. 7 is a flow chart illustrating a method for determining a secondary injection point for half-cycle backward wrapping according to an embodiment of the present invention.

FIG. 7 is a flow chart illustrating a method for determining a secondary or new injection point for half-cycle backward wrapping according to an embodiment of the present invention. The secondary or new injection point replaces an initial injection point. At step 701, I is designated a value 2.

At step 702, the value at the delay output of the logic components at stage 1 of the phase of the phase vernier and the value at the delay output of the logic component at the Ith stage of the phase vernier are compared.

At step 703, it is determined whether the values at the delay outputs differ. If the values differ, control proceeds to step 704. If the values do not differ, control proceeds to step 705.

At step 704, stage 1 is designated as the secondary or new injection point.

At step 705, the value I is set to I+1. Control proceeds to step 702.

According to an embodiment of the present invention, the values from the delay output of the logic components (sample bits) are retrieved by the sampling unit 500 (shown in FIG. 5). It should be appreciated that when an estimation technique is used by the phase vernier 100 (shown in FIG. 1) to determine a secondary injection point, the sampling unit 500 is not required and need not be implemented.

Figure 8:
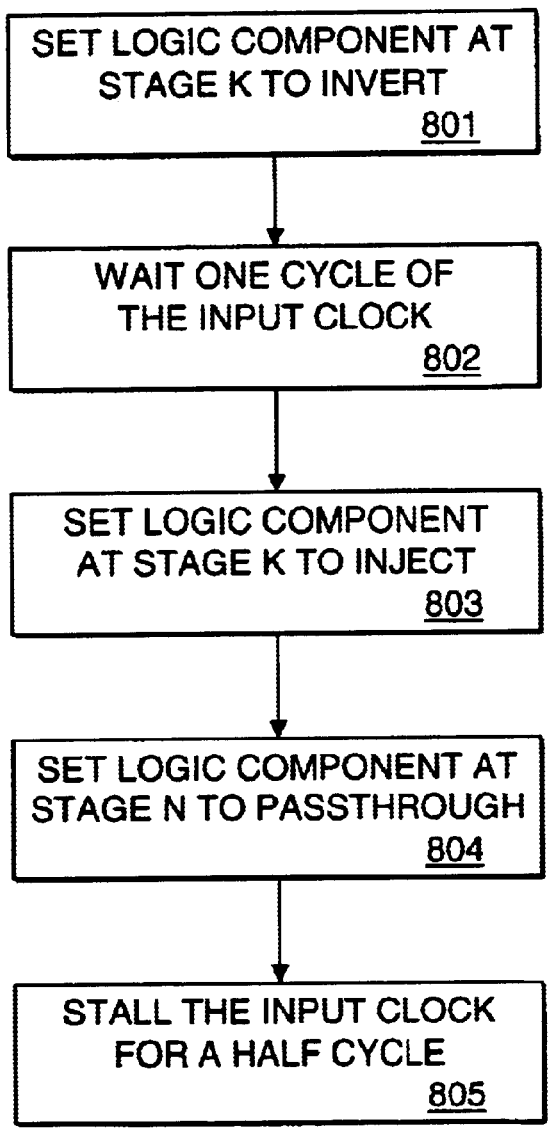
FIG. 8 is a flow chart illustrating a method for forward wrapping according to an embodiment of the present invention.

In order to reduce glitches, the following procedure may used to perform half-cycle forward wrapping once a secondary injection point is determined. FIG. 8 is a flow chart illustrating a method for performing forward wrapping. The method may be used when an injection point is moved from an Nth or final stage in a phase vernier to an earlier stage or a secondary injection point K. At step 801, a logic component at the stage of the secondary injection point is set to an invert mode. According to an embodiment of the present invention, the logic component at the last stage of the phase vernier (stage N) is kept in the inject mode.

At step 802, one input clock cycle is allowed to pass. This allows the phase vernier to refill.

At step 803, the logic component at the stage of the secondary injection point is set to inject mode.

At step 804, the logic component at the last stage of the phase vernier is set to a passthrough mode. According to an embodiment of the present invention, steps 803 and 804 are performed simultaneously.

At step 805, the input clock is stalled for one half cycle. According to an embodiment of the present invention, steps 803–805 may be performed simultaneously in order to reduce glitches.

Figure 9:
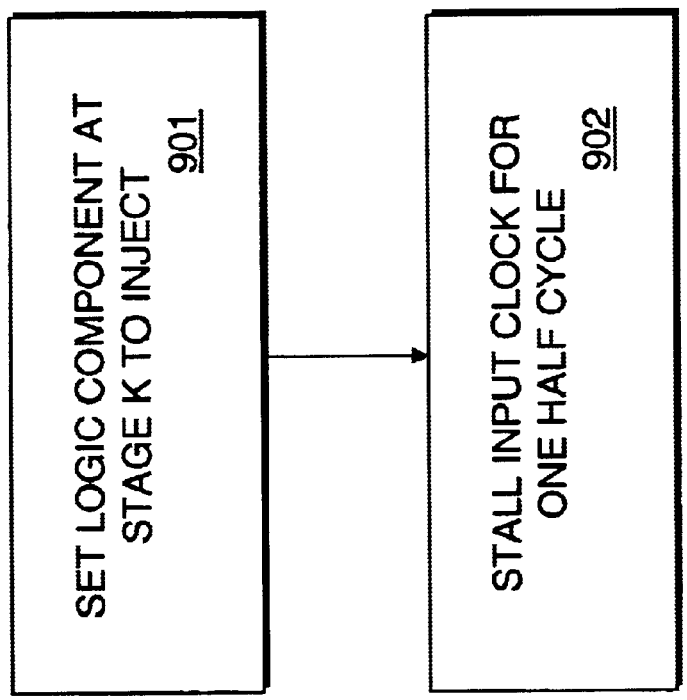
FIG. 9 is a flow chart illustrating a method for backward wrapping according to an embodiment of the present invention.

Similarly, the following procedure may used to perform half-cycle backward wrapping in order to reduce glitches. FIG. 9 is a flow chart illustrating a method for performing backward wrapping. The method may be used when an injection point is moved from a first stage in the phase vernier to a later stage or a secondary injection point K. At step 901, a logic component at the stage of the secondary injection point is set to an inject mode.

At step 902, the input clock is stalled for one half cycle. According to an embodiment of the present invention, steps 901 and 902 may be performed simultaneously in order to reduce glitches.

Figure 10A:
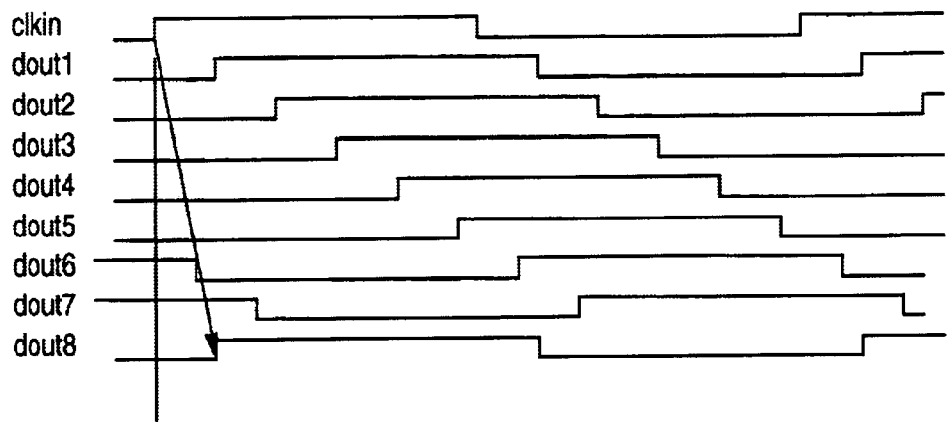
FIGS. 10a–g is a timing diagram illustrating a state of a phase vernier as a secondary injection point for half-cycle forward wrapping is determined according to an embodiment of the present invention.

FIGS. 10a–g are timing diagrams that illustrate states of the phase vernier 200 (shown in FIG. 5) as a secondary injection point for half-cycle forward wrapping is determined according to the method described in FIG. 6. FIG. 10a is a timing diagram that illustrates an initial state of the phase vernier 200. The logic component 218 (shown in FIG. 5) at stage 8 is in the injection mode which puts the phase vernier 200 at its maximum advance configuration.

Figure 10B:
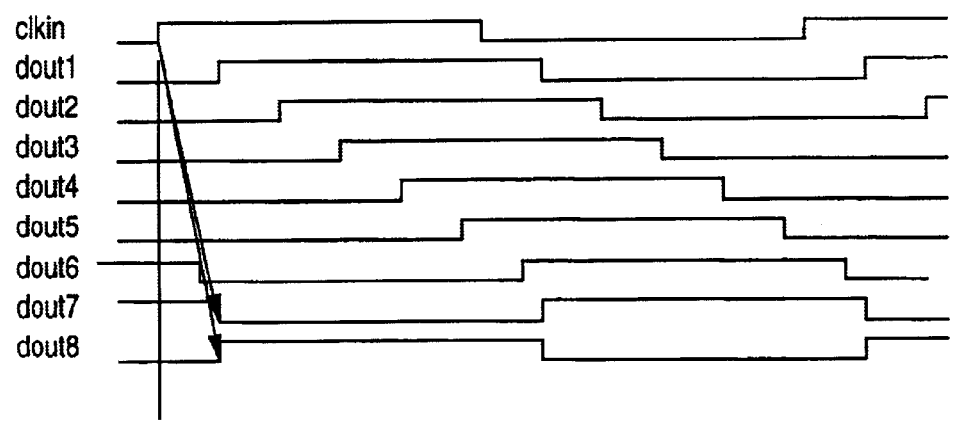

FIG. 10b is a timing diagram that illustrates the state of the phase vernier 200 after logic component 217 (shown in FIG. 5) at stage 7 of the phase vernier 200 is set to an invert mode. The arrow pointing to the signal at dout7 represents the current secondary injection point. The sample vector for this state of the phase vernier 200 is 01100000. The value at the delay output of logic component 217 at stage 7 is one. The value at the delay output of logic component 218 at stage 8 is zero. A next injection point needs to be tested to determine the secondary injection point.

Figure 10C:
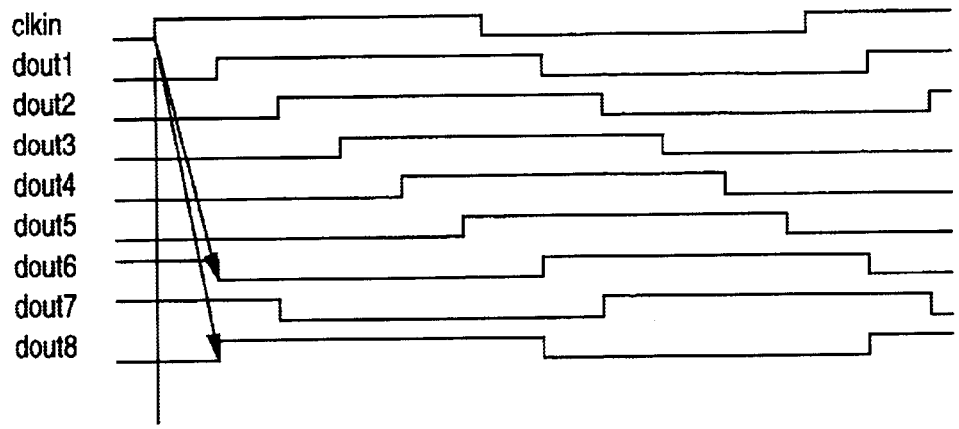

FIG. 10c is a timing diagram that illustrates the state of the phase vernier 200 after logic component 216 (shown in FIG. 5) at stage 6 of the phase vernier 200 is set to an invert mode. The arrow pointing to the signal at dout6 represents the current secondary injection point. The sample vector for this state of the phase vernier 200 is 01100000. The value at the delay output of logic component 217 at stage 7 is one. The value at the delay output of logic component 218 at stage 8 is zero. A next injection point needs to be tested to determine the secondary injection point.

Figure 10D:
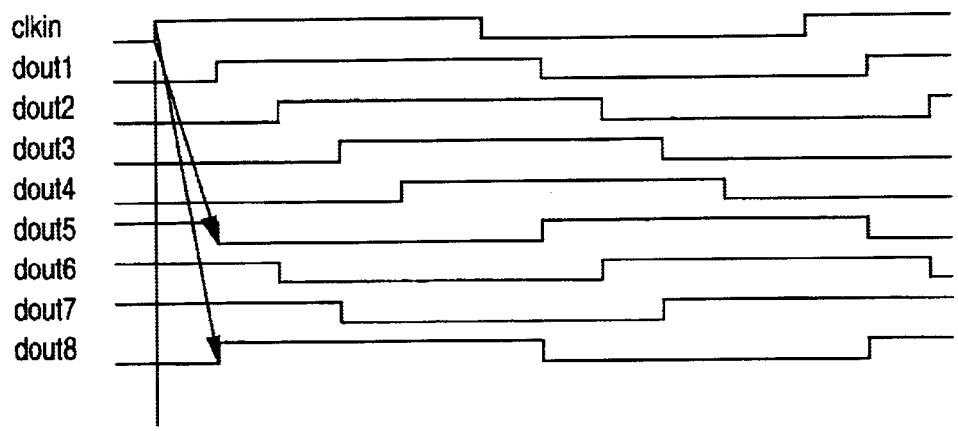

FIG. 10d is a timing diagram that illustrates the state of the phase vernier 200 after logic component 215 (shown in FIG. 5) at stage 5 of the phase vernier 200 is set to an invert mode. The arrow pointing to the signal at dout5 represents the current secondary injection point. The sample vector for this state of the phase vernier 200 is 01110000. The value at the delay output of logic component 217 at stage 7 is one. The value at the delay output of logic component 218 at stage 8 is zero. A next injection point needs to be tested to determine the secondary injection point.

Figure 10E:
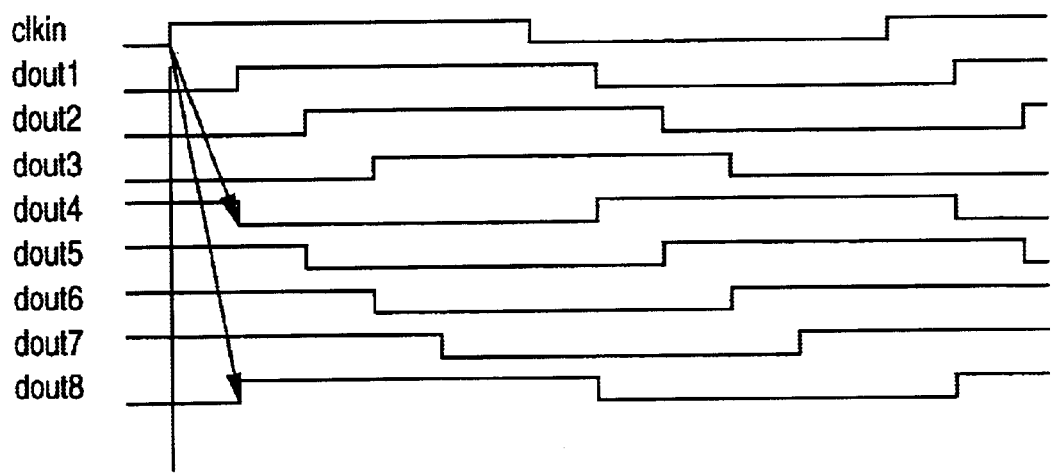

FIG. 10e is a timing diagram that illustrates the state of the phase vernier 200 after logic component 214 (shown in FIG. 5) at stage 4 of the phase vernier 200 is set to an invert mode. The arrow pointing to the signal at dout4 represents the current secondary injection point. The sample vector for this state of the phase vernier 200 is 01111000. The value at the delay output of logic component 217 at stage 7 is one. The value at the delay output of logic component 218 at stage 8 is zero. A next injection point needs to be tested to determine the secondary injection point.

Figure 10F:
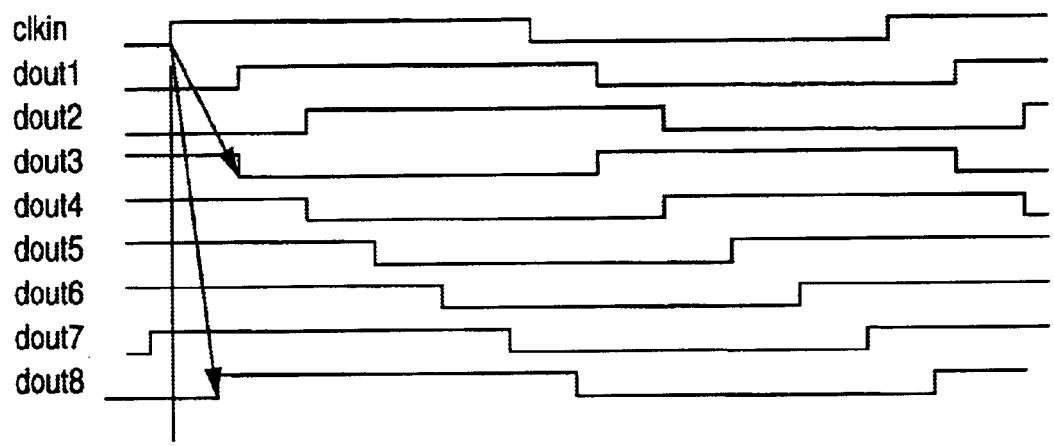

FIG. 10f is a timing diagram that illustrates the state of the phase vernier 200 after logic component 213 (shown in FIG. 5) at stage 3 of the phase vernier 200 is set to an invert mode. The arrow pointing to the signal at dout3 represents the current secondary injection point. The sample vector for this state of the phase vernier 200 is 01111100. The value at the delay output of logic component 217 at stage 7 is one. The value at the delay output of logic component 218 at stage 8 is zero. A next injection point needs to be tested to determine the secondary injection point.

Figure 10G:
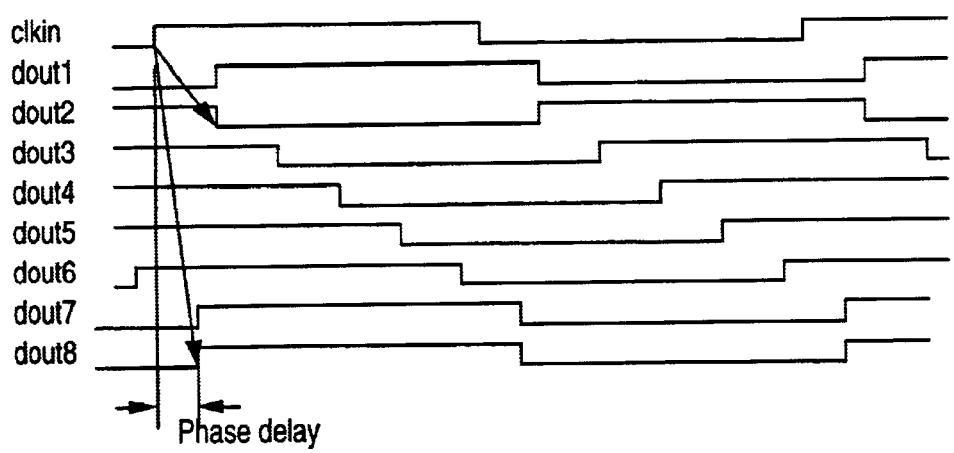

FIG. 10g is a timing diagram that illustrates the state of the phase vernier 200 after logic component 212 (shown in FIG. 5) at stage 2 of the phase vernier 200 is set to an invert mode. The arrow pointing to the signal at dout2 represents the current secondary injection point. The sample vector for this state of the phase vernier 200 is 00111110. The value at the delay output of logic component 217 at stage 7 is zero. The value at the delay output of logic component 218 at stage 8 is zero. The value at the delay output of logic component 217 at stage 7 indicates that the secondary injection point is correctly placed at stage 2.

Figure 11:
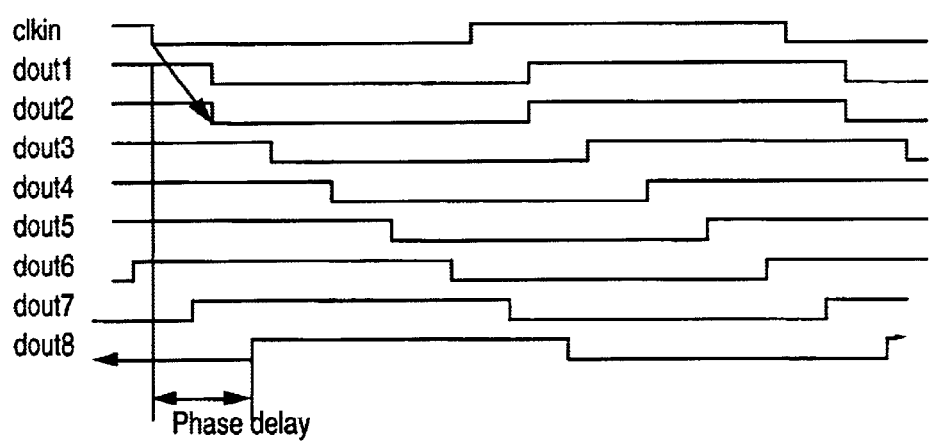
FIG. 11 is a timing diagram illustrating a state of a phase vernier as forward wrapping is performed according to an embodiment of the present invention.

FIG. 11 is a timing diagram that illustrates a state of the phase vernier 200 (shown in FIG. 5) as half-cycle forward wrapping is performed according to the method described in FIG. 8. FIG. 11 illustrates the state of the phase vernier 200 (shown in FIG. 5) after logic component 212 (shown in FIG. 5) at stage 2 is set to an inject mode, logic component 217 (shown in FIG. 5) at stage 7 is set to a passthrough mode, and the input clock is stalled for a half cycle.

Figure 12:
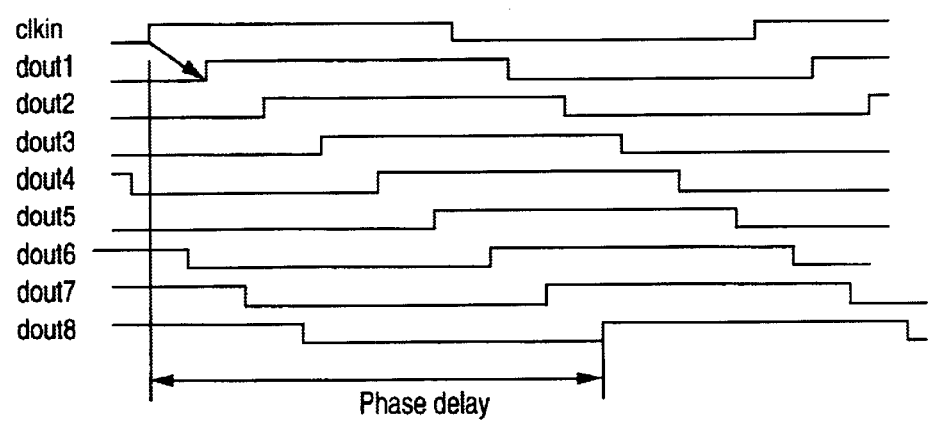
FIG. 12 is a timing diagram illustrating a state of a phase vernier as a secondary injection point for half-cycle backward wrapping is determined according to an embodiment of the present invention.

FIG. 12 is a timing diagram that illustrates a state of the phase vernier 200 (shown in FIG. 5) as a secondary injection point for half-cycle backward wrapping is determined according to the method described in FIG. 7. FIG. 12 is a timing diagram that illustrates an initial state of the phase vernier 200. The logic component 211 (shown in FIG. 5) at stage 1 is in the injection mode which puts the phase vernier 200 at its maximum delay configuration. The sample vector for this state of the phase vernier 200 is 11100000. The value of the delay output of logic component 211 is zero. The value of the delay output of the logic component 216 (shown in FIG. 5) is the first value which differs from the value of the delay output of logic component 211.

Figure 13:
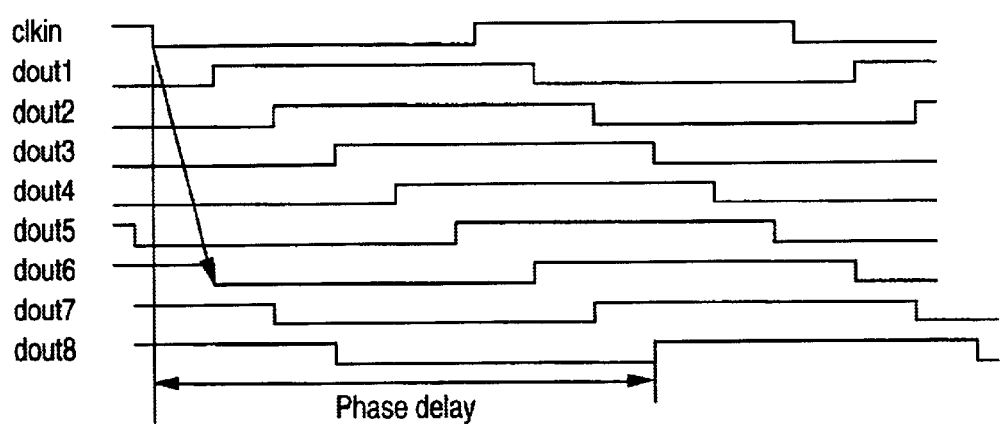
FIG. 13 is a timing diagram illustrating a state of a phase vernier as backward wrapping is performed according to an embodiment of the present invention.

FIG. 13 is a timing diagram that illustrates a state of the phase vernier 200 (shown in FIG. 5) as half-cycle backward wrapping is performed according to the method described in FIG. 9. FIG. 13 illustrates the state of the phase vernier 200 (shown in FIG. 5) after logic component 216 (shown in FIG. 5) at stage 6 is set to an inject mode, and the input clock is inverted by stalling it for a half cycle.

Figure 14:
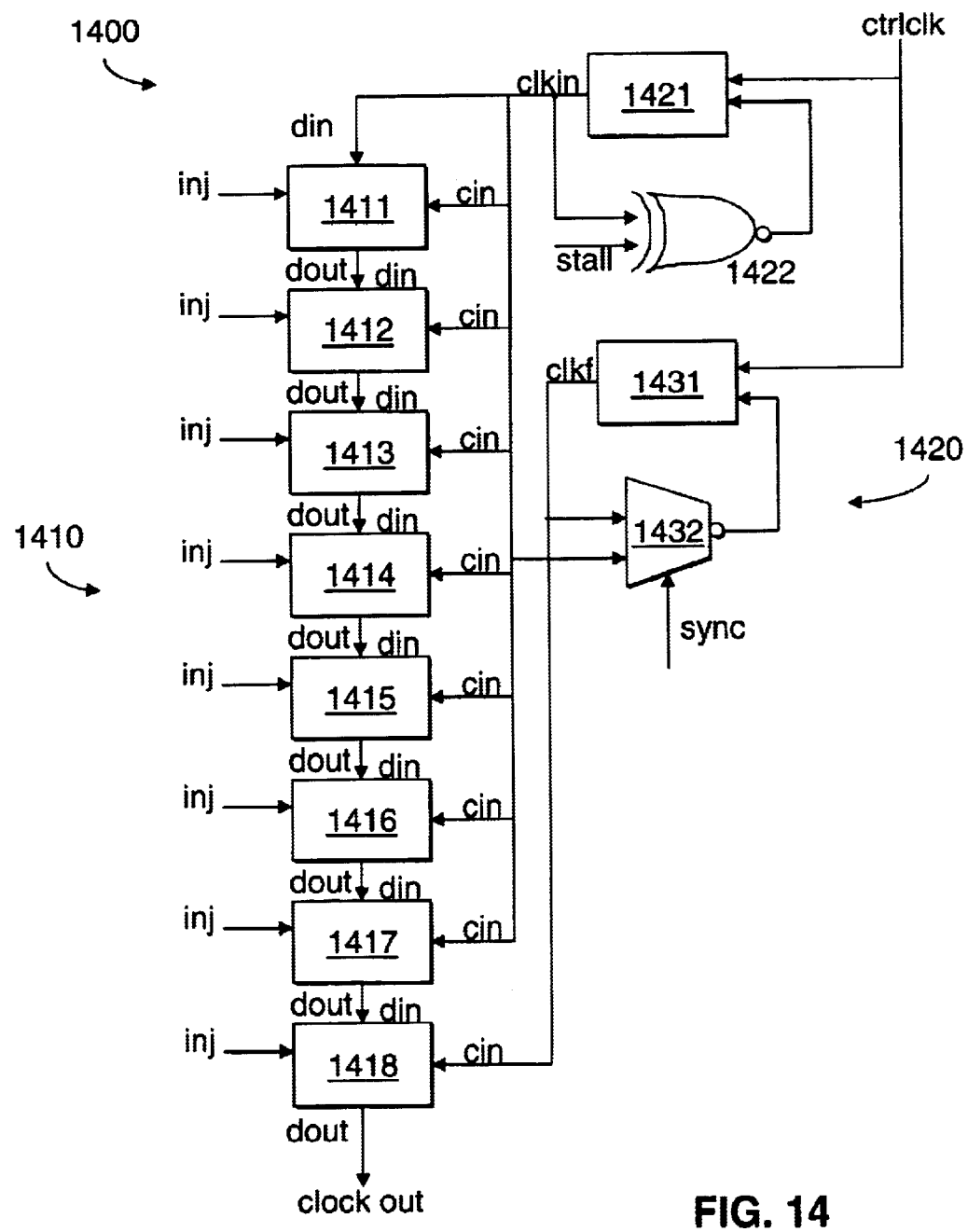
FIG. 14 is a block diagram illustrating a phase vernier according to an alternate embodiment of the present invention.

FIG. 14 is a block diagram of an alternate embodiment of a phase vernier 1400 according to an embodiment of the present invention. The phase vernier 1400 may be implemented as the phase vernier 110 shown in FIG. 1. The phase vernier includes a plurality of logic components 1410 shown individually as logic components 1411–1418. Each of the logic components includes a delay input (din), clock input (cin), injection input (inj), and delay output (dout). The plurality of logic components 1410 are connected in series where the delay output of a logic component is connected to the delay input of subsequent logic component in the series. The first logic component 1411 in the series receives an input clock signal at its delay input. The delay output of the last logic component 1418 in the series is the adjusted input clock signal and is designated as clock out.

Similarly to the phase vernier 200 showing FIG. 2, each of the logic components is designated a stage in the phase vernier 1400 that provides a delay stage. An input to a logic component is output after a time period provided by its delay stage. Eight logic components 1411–1418 are shown in the phase vernier 1400. According to an embodiment of the present invention, the phase vernier 1400 includes N logic components, where N is a number of logic components that provides a cumulative delay equal to at least half a clock period of the input clock. When each of the logic components introduce a same amount of delay, the number of logic components required is half the clock period divided by the minimum propagation delay per logic component.

According to an embodiment of the phase vernier 1400, each of the logic components may be set to one of two modes. In a passthrough mode, the delay output of a logic component outputs an input at the delay input. In an inject mode, the delay output of a logic component outputs an input at the clock input. In one embodiment, a logic component is set to a passthrough mode when the injection input receives a zero. A logic component is set to an inject mode when the inject input receives a one. The logic components 1411–1418 may be implemented using field programmable gate array (FPGA) look up tables, logic circuits or other devices.

The phase vernier 1400 includes a clocking circuit 1420. The clocking circuit 1420 includes a first clock divider 1421 that receives a clocking signal (cntrlclk) from a clock (not shown) operating at twice the frequency of clock out. The first clock divider 1421 divides the clocking signal by two to generate the input clock. The input clock is distributed in parallel to the clock input of the logic components 1411–1417. According to an embodiment of the phase vernier 1400, the clocking circuit 1420 optionally includes a clock regulator 1422. The clock regulator 1422 operates to stall the output of the first clock divider 1421 in response to a stall signal. The clocking circuit 1420 includes a second clock divider 1431. The second clock divider 1431 divides the clocking signal by two to generate a second input clock (clkf). The second input clock is distributed to the clock input of the last logic component 1418 in the phase vernier 1400. The clocking circuit 1420 includes a clock synchronizer 1432. The clock synchronizer 1432 operates to synchronize the second input clock generated by the second clock divider 1431 with the input clock generated by the first clock divider 1421 in response to a synchronization signal. According to an embodiment of the clocking circuit 1420, the first and second clock dividers 1421 and 1422 may be implemented by DQ flip-flops. The clock regulator 1422 may be implemented by a circuit performing an exclusive-NOR function. The clock synchronizer 1432 may be implemented with a multiplexer and an inverter. The phase vernier 1400 may be used similarly as the phase vernier 200 to retard or advance a phase of the input clock by performing full-cycle and half-cycle wrapping.

Figure 15:
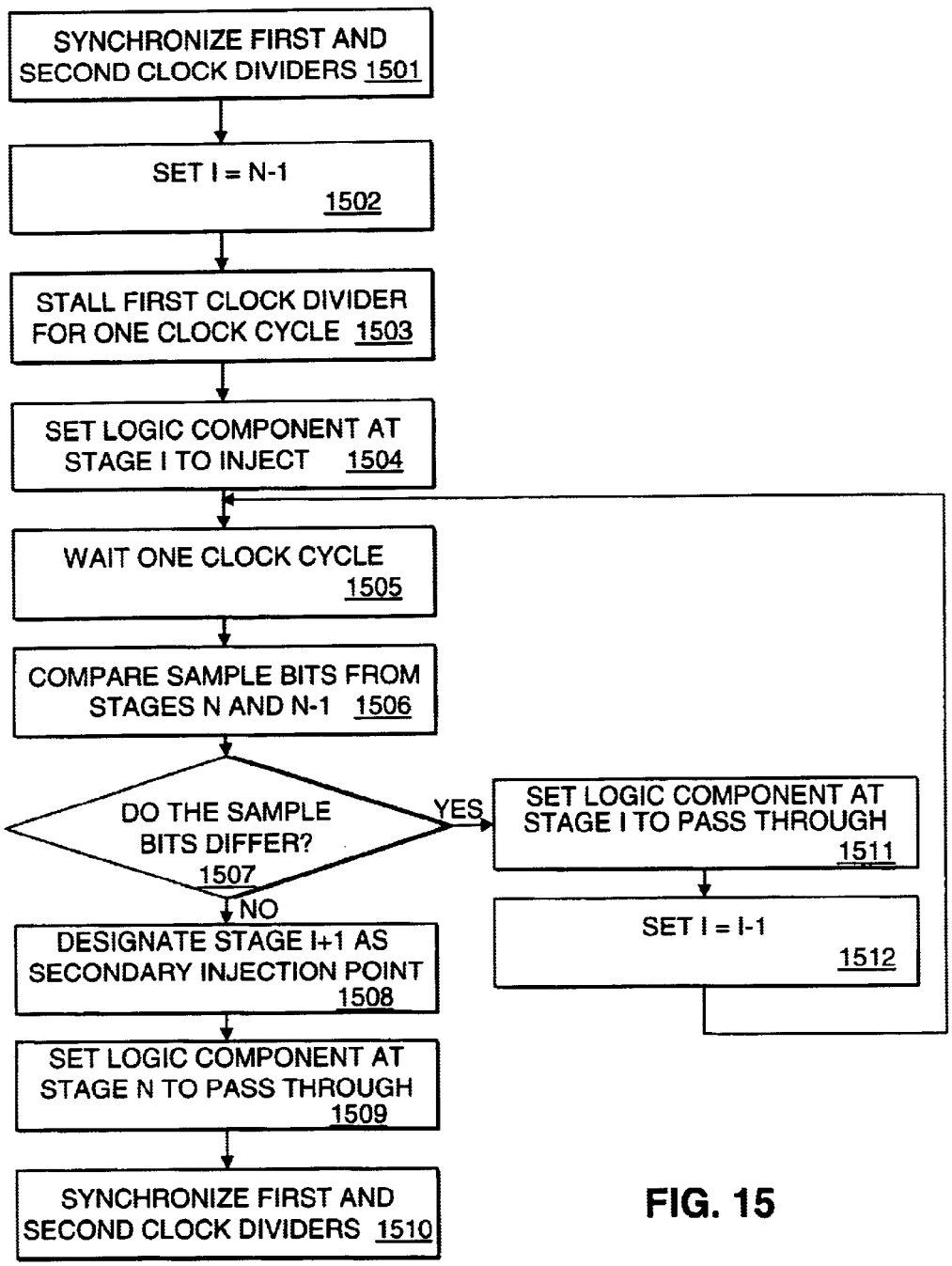
FIG. 15 is a flow chart illustrating a method for determining a secondary injection point for half-cycle forward wrapping according to an alternate embodiment of the present invention.

FIG. 15 is a flow chart that illustrates a method for determining a secondary injection point for half-cycle forward wrapping using the phase vernier 1400 shown in FIG. 14. At step 1501, the first and second clock dividers are synchronized such that a input clock generated by the first clock divider and a second input clock generated by the second clock divider are in phase.

At step 1502, I is set to a value N−1, where N is the number of logic components or stages of a phase vernier.

At step 1503, the first clock divider is stalled for one clock cycle.

At step 1504, a logic component at stage 1 is set to an inject mode.

At step 1505, one clock cycle is allowed to pass.

At step 1506, a value at a delay output of a logic component of a Nth stage (last stage) of the phase vernier and the value at a delay output of a logic component at the N−1th (second to last stage) of the phase vernier are compared.

At step 1507 is determined whether the values at the delay outputs differ. If the values do not differ, control proceeds to step 1508, if the values differ, control proceeds to step 1511.

At step 1508, stage 1+1 is designated as the secondary injection point.

At step 1509, the logic component at stage 1 is set to a passthrough mode.

At step 1510, the first and second clock dividers are synchronized.

At step 1511, the logic component at stage 1 is set to a passthrough mode.

At step 1512, the value I is set to a value I−1. Control returns to step 1504.

Figure 16A:
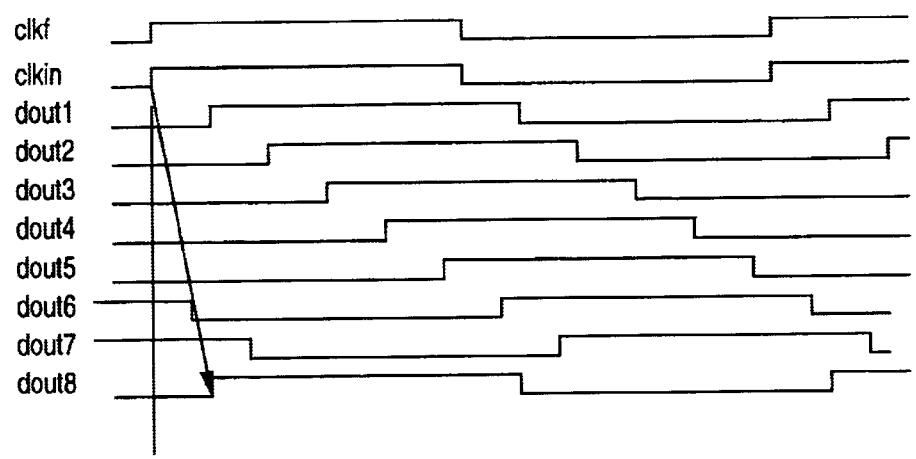
FIGS. 16a–e is a timing diagram illustrating a state of a phase vernier as a secondary injection point for half-cycle forward wrapping is determined according to an alternate embodiment of the present invention.

FIGS. 16a–e are timing diagrams that illustrate states of the phase vernier 1400 (shown in FIG. 14) as a secondary injection point for half-cycle forward wrapping is determined according to the method described in FIG. 15. FIG. 16a is a timing diagram that illustrates an initial state of the phase vernier 1400. The logic component 1418 (shown in FIG. 14) at stage 8 is in the injection mode which puts the phase vernier 1400 at its maximum advance configuration.

Figure 16B:
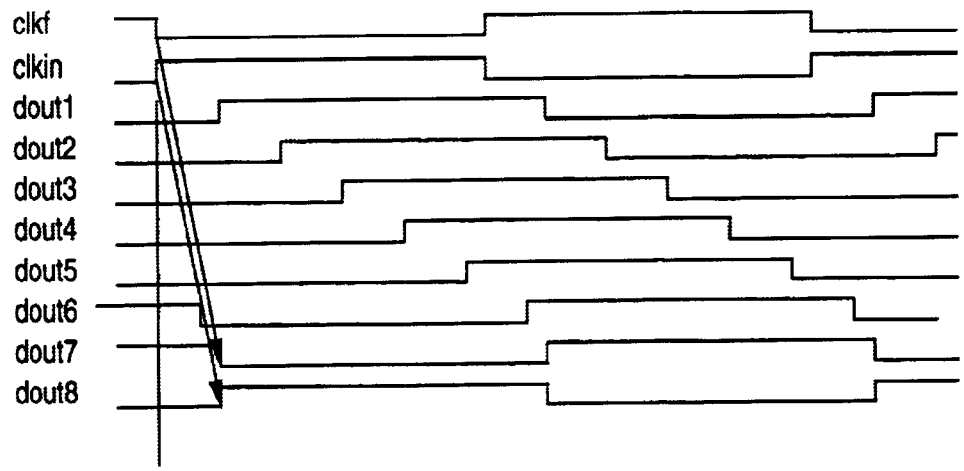

FIG. 16b is a timing diagram that illustrates the state of the phase vernier 1400 after the first clock divider has been stalled for one clock cycle and the logic component 1417 (shown in FIG. 14) at stage 7 of the phase vernier 1400 is set to an inject mode. The sample vector for this state of the phase vernier 1400 is 01100000. The value at the delay output of logic component 1417 at stage 7 is one. The value at the delay output of logic component 1418 at stage 8 is zero. A next injection point needs to be tested to determine the secondary injection point.

Figure 16C:
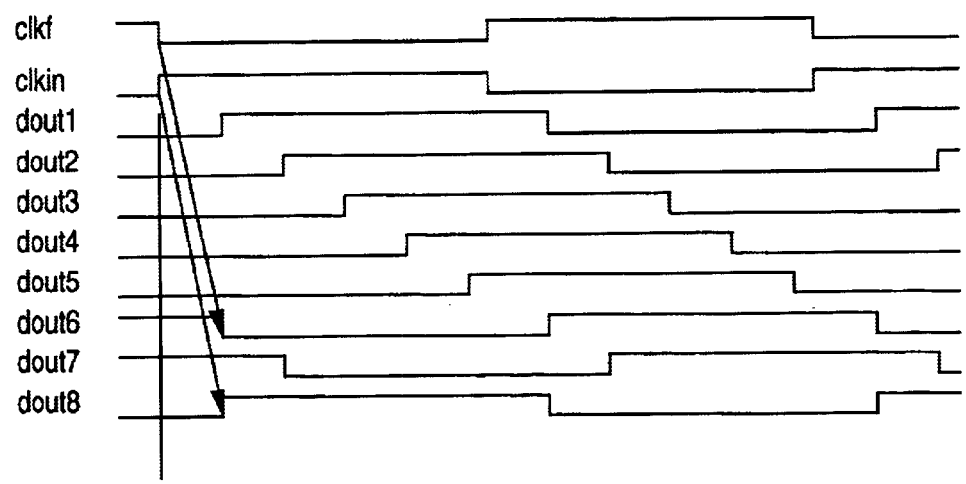

FIG. 16c is a timing diagram that illustrates the state of the phase vernier 1400 after the logic component 1416 (shown in FIG. 14) at stage 6 of the phase vernier 1400 is set to an inject mode. The sample vector for this state of the phase vernier 1400 is 01100000. The value at the delay output of logic component 1417 at stage 7 is one. The value at the delay output of logic component 1418 at stage 8 is zero. A next injection point needs to be tested to determine the secondary injection point.

Figure 16D:
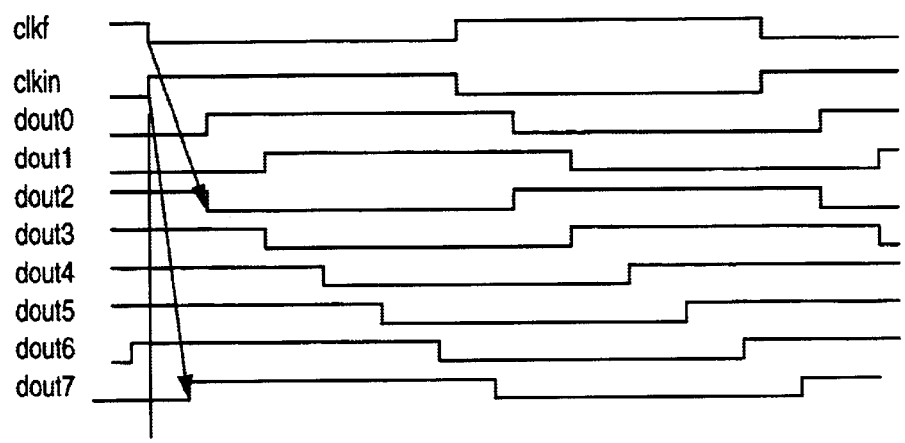

The next injection points would be tested similarly as shown in FIGS. 16b and 16c. FIG. 16d is a timing diagram that illustrates the state of the phase vernier 1400 after the logic component 1413 (shown in FIG. 14) at stage 3 of the phase vernier 1400 is set to an inject mode. The sample vector for this state of the phase vernier 1400 is 01111100. The value at the delay output of logic component 1417 at stage 7 is one. The value at the delay output of logic component 1418 at stage 8 is zero. A next injection point needs to be tested to determine the secondary injection point.

Figure 16E:
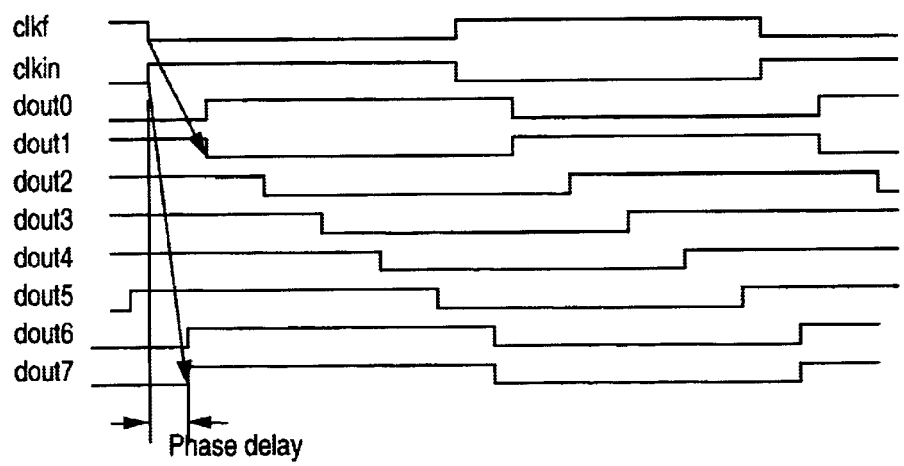

FIG. 16e is a timing diagram that illustrates the state of the phase vernier 1400 after the logic component 1412 (shown in FIG. 14) at stage 2 of the phase vernier 1400 is set to an inject mode. The sample vector for this state of the phase vernier 1400 is 00111110. The value at the delay output of logic component 1417 at stage 7 is zero. The value at the delay output of logic component 1418 at stage 8 is zero. The value at the delay output of logic component 1417 at stage 7 indicates that the secondary injection point is correctly placed at stage 2.

Referring to FIG. 1, the delay circuit 100 includes a controller 130. The controller 130 may operate to set the logic components in the phase vernier 110 to various modes and to stall and synchronize the clock dividers in the phase vernier 110 in order to determine secondary injection points and perform forward and backward wrapping as described in FIGS. 6–9, and 15. It should be appreciated that the controller 130 may be implemented using hardware circuitry, software or a combination of hardware and software. The phase vernier 110, sampling unit 120, and controller 130 may be implemented using other known circuitry or techniques. According to an embodiment of the delay circuit 100, the phase vernier 110, sampling unit 120, and controller 130 all reside on a single seminconductor substrate.

FIGS. 6–9, and 15 illustrate flow charts describing methods for determining a secondary injection point, and methods for performing forward and backward wrapping. Some of the steps illustrated in these figures may be performed sequentially, in parallel or in an order other than that which is described. It should be appreciated that not all of the steps described are required to be performed, that additional steps may be added, and that some of the illustrated steps may be substituted with other steps.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A method for adjusting a phase of an input using a delay circuit, comprising:
    retarding the phase by setting a first logic component in a first stage of the delay circuit to an inject mode and making the logic component a primary injection point;
    performing backward wrapping; and
    further retarding the phase by setting a logic component in a stage prior to a secondary injection point into the inject mode.

2. The method of claim 1, wherein performing backward wrapping comprises determining the secondary injection point where a second logic component of the delay circuit is set into the inject mode.

3. The method of claim 1, further comprising setting a second logic component corresponding to the secondary injection point to a passthrough mode.

4. The method of claim 2, wherein determining the secondary injection point comprises:
    determining a number of stages required for generating a delay equal to half a cycle of the input;
    adding the number of stages to the first stage to determine a stage of the secondary injection point.

5. The method of claim 2, further comprising
    setting a logic component in a stage prior to the stage of the secondary injection point to an invert mode.

6. The method of claim 1, wherein backward wrapping comprises:
    determining the secondary injection point where a second logic component of the delay circuit is set into the inject mode; and
    stalling the input for one half cycle after setting the second logic component.

7. The method of claim 6, wherein determining the secondary injection point comprises determining a stage down the delay circuit that has a logic component with a delay output value different from a delay output value of the logic component from the first stage of the delay circuit.

8. The method of claim 2, wherein determining the secondary injection point comprises:
    determining a number of stages required for generating a delay equal to a full cycle of the input;
    adding the number of stages to the first stage to determine a stage of the secondary injection point.

9. A method for adjusting a phase of an input using a delay circuit, comprising:
    advancing the phase by setting a first logic component in a last stage of the delay circuit to an inject mode and making the logic component a primary injection point;
    performing forward wrapping; and
    further advancing the phase by setting a logic component in a stage subsequent to a secondary injection point into the inject mode.

10. The method of claim 9, wherein performing forward wrapping comprises determining the secondary injection point where a second logic component of the delay circuit is set into the inject mode.

11. The method of claim 9, further comprising setting a second logic component corresponding to the secondary injection point to a pass through mode.

12. The method of claim 10, wherein determining the secondary injection point comprises:
   determining a number of stages required for generating a delay equal to half a cycle of the input;
   subtracting the number of stages from the last stage to determine a stage of the secondary injection point.

13. The method of claim 10, further comprising setting a logic component in a stage prior to the stage of the secondary injection point to an invert node.

14. The method of claim 9, wherein forward wrapping comprises:
   determining the secondary injection point;
   setting the second logic component to an invert mode;
   waiting a cycle of the input after setting the second logic component;
   simultaneously setting the second logic component to an inject mode and the logic component at the last stage to a passthrough mode; and
   stalling the input for one half cycle after simultaneously setting the second logic component.

15. The method of claim 14, wherein determining the secondary injection point comprises:
   designating a stage prior to the last stage as stage i;
   setting a logic component in the stage i to an invert mode;
   waiting a delay; and
   comparing a delay output value from the logic component in the last stage with a delay output value from the logic component in the stage prior to the last stage.

16. The method of claim 15 further comprising designating the stage i as the secondary injection point if the delay output values do not differ.

17. The method of claim 15 further comprising designating the stage i+1 as the secondary injection point if the delay output values do not differ.

18. The method of claim 15 further comprising setting the logic component in the stage i to a passthrough mode and setting a value i to i−1 if the delay output values differ.

19. The method of claim 9, wherein forward wrapping comprises:
   synchronizing a second input with the first input;
   setting a stage prior to the last stage as stage i;
   setting a logic component in the stage i to the inject mode;
   setting a logic component in a stage i+1 to a passthrough mode;
   waiting a delay; and
   comparing a delay output value from the logic component from the last stage with a delay output value from a logic component in the stage prior to the last stage.

20. The method of claim 19 further comprising designating a stage i+1 as the secondary injection point if the delay output values do not differ.

21. The method of claim 19 further comprising setting a logic component in the stage i to a pass through mode and setting a value i to i−1 if the delay output values do not differ.

22. The method of claim 21 further comprising:
   setting the logic component at the last stage to a pass through mode; and
   synchronizing the second input with the first input.

23. The method of claim 10, wherein determining the secondary injection point comprises:
   determining a number of stages required for generating a delay equal to a full cycle of the input;
   subtracting the number of stages from the last stage to determine a stage of the secondary injection point.

* * * * *